United States Patent [19]
Chen

[11] Patent Number: 6,008,578
[45] Date of Patent: Dec. 28, 1999

[54] FULL-COLOR ORGANIC ELECTROLUMINESCENT DEVICE WITH SPACED APART FLUORESCENT AREAS

[76] Inventor: Hsing Chen, 5F, No. 83, Jen-Ai St., Hsinchu, Taiwan

[21] Appl. No.: 09/026,681

[22] Filed: Feb. 20, 1998

[51] Int. Cl.$^6$ .................................................. H05B 33/14
[52] U.S. Cl. .................... 313/506; 313/509; 313/498; 313/500; 313/505
[58] Field of Search .................... 313/502, 504, 313/506, 507, 503, 498, 509, 500, 501, 505, 463, 422, 466, 496

[56] References Cited

U.S. PATENT DOCUMENTS

| | | | |
|---|---|---|---|
| 4,682,075 | 7/1987 | Nelson et al. | 313/466 |
| 5,015,999 | 5/1991 | Imai et al. | 340/70 |
| 5,294,870 | 3/1994 | Tang et al. | 313/504 |
| 5,589,732 | 12/1996 | Okibayashi et al. | 313/504 |
| 5,606,225 | 2/1997 | Levine et al. | 313/558 |

*Primary Examiner*—Nimeshkumar D. Patel
*Assistant Examiner*—Joseph Williams
*Attorney, Agent, or Firm*—Dougherty & Troxell

[57] ABSTRACT

The present invention discloses a full-color organic electroluminescent device using an organic electroluminescent element capable of emitting of ultra-violet light with wave length 380~400 nm as a basic element, coated with a layer of different fluorescent media (wave length converting layer) on its surface. By way of this ultra-violet light organic electroluminescent element, ultra-violet light is produced, which in turn excites the fluorescent layer to emit fluorescent lights with different colors according to the fluorescent media used, i.e. the red fluorescent medium emits red light, and the green fluorescent medium emits green light. R, G, B three color fluorescent media emit white light. By applying this principle, a high brilliance, low current and low energy consuming full-color display device may be fabricated.

11 Claims, 6 Drawing Sheets

FULL-COLOR ORGANIC ELECTROLUMINESCENT DEVICE WITH SPACED APART FLUORESCENT AREAS

BACKGROUND OF THE INVENTION

1. Field of the Invention

The present invention relates to a full-color organic electroluminescent device (abbreviated as FOELD), and more particularly, relates to an full-color organic electroluminescent device (FOELD) which has a fundamental structure composed of two electrodes with a light emitting layer interposed therebetween to emit a light with the wave length approximately between 380–400 nm close to ultra violet ray region and to a process for this fabrication.

2. Description of the Prior Art

A FOEL device is a direct current driven light emitting device with a fundamental structure composed of two electrodes with a light emitting layer interposed therebetween. When a bias voltage is applied on the OEL device, positive holes and electrons are emitted from the anode and the cathode respectively. Then after having passed over their corresponding energy barriers, they meet with at the light emitting layer to form excitons. A light is emitted therefrom in radiation mode by degenerating those excited excitons to the ground state. The color of light exhibited by such a device is closely related to the light emitting material employed. If a light emitting material possesses a relatively larger energy gap, the device formed will emit a blue light or an ultra-violet light, while the device emits a red light if the light emitting material possesses a smaller energy gap. For a light emitting device to deliver light, at least one of the electrodes should be transparent, made of a thin film material such as Indium Tin Oxide (ITO).

It is advantageous that an OEL is a low energy consuming device, able to generate light of various color with the brightness as high as above 6000 cd/m$^2$, with a broad viewing angle as broad as 160°, and with the response time as rapid as only several $\mu$s, which is 100 times quicker than that of a LCD. Moreover, its manufacturing process is much more simple and easier than that of a LCD, and the total thickness of an OELD is only about 2 mm. Its major weak point, short life, of initial stage, has been overcome and improved to be as durable as to reach about 20,000 hours, so that it has a very strong competitive potential versus LCD in the present market.

It is a dream for the manufacturers to make a full-color OELD capable of emitting light without a back light source, with the features of energy saving, thin in dimension, and easy manufacturing, and highly commercially competitive versus LCD in the market.

There are three methods for manufacturing a full-color organic electroluminescent device (FOELD):

1. Using a white light organic electroluminescence as a basic element to make the organic EL emit white light. R, G, B original light are produced by placing a light filter on its surface.
2. Using a blue light organic electroluminescence as a basic element, and adding a wave-length conversion layer on its surface to convert a part of blue light into red light, and another part of blue light into green light, R, G, B three primary light are thus produced, as disclosed by Eastman Kodak Co. in U.S. Pat. No. 5,294,870, 1994.
3. Directly using an organic electroluminescence of R, G, B three lights as a basic element to form a full-color device as disclosed in patent No. 318,966 UROC and No. 294,842 ROC, such a structure is theoretically most ideal. However, at present, except the blue light organic ELD which can emit pure blue light, the red and the green light organic ELD can not produce pure green and pure red lights. It is rather complicated in manufacturing processes to put organic ELD of various color together, this is the reason why a blue light OEL element is utilized as the fundamental structure for producing R, G, B three light, as described in above method 2.

The method described in method 1 has a low brightness due to a light filter is placed on the surface of OEL, accordingly, its light generating efficiency is rather low. On the other hand, in the second method described in method 2, the mixed hues of blue-red and blue-green are produced first, a light filter layer is inevitably required to filter out the blue light such that the brightness is reduced, the production cost increased, and the manufacturing process is more complicated. As for the third method, this is the worst among three, by comparing the complexibility in manufacturing process, high cost and the non-homogeneity of brightness in the device.

SUMMARY OF THE INVENTION

The manufacturing techniques of a full-color organic electroluminescent device according to the present invention is different from those of the above described three methods. An OEL which is emitable at near ultra violet light with wave-length 380–400 nm is used as a basic element, coated with different fluorescent media (wave-length conversion layer) on its surface. By means of this ultra-violet OEL, ultra-violet light is produced which excites the fluorescent layer thereon to emit fluorescent lights with different colors according to the fluorescent media used, i.e. the red fluorescent media emits red light, the green fluorescent media emits green light. R, G, B three color fluorescent media emit white light.

The full-color organic electroluminesent device of the present invention is based on ultra-violet organic electroluminesent device, with wave-length around 380–400 nm, a fluorescent layer capable of conversion of a wave-length, is coated on UVOELD, ultra-violet light emitted from the device will excite the fluorescent layer to emit light of various colors, e.g., red light fluorescent material will emit red light, green light fluorescent material will emit green light, white light will be emitted when red, green and blue light fluorescent materials are mixed together.

Each light emitting point on the substrate of the present invention belongs to the same ultra-violet light emitable material. It has many advantageous features over other inventions, such as having a simple and easy manufacturing processes resulting in uniform brightness, excellent yield rate, being capable of being driven by the same voltage, and easy quality control. In addition, R, G, B three color fluorescent media materials are printed directly onto its glass substrate. The preceding manufacturing process of forming an ultra-violet OEL and the subsequent manufacturing process of forming of a layer of fluorescent material can be separately built or manufactured and then the two parts integrated together without the necessity of employing a filter layer. The fluorescent material layer excited by a near ultra-violet light is aging resistant, the average lifetime of the structure will last for as long as over 20,000 hours.

FIG. 2 shows a structure of a conventional ultra violet organic electroluminescence (UOEL), wherein PBD 32 is used as an electron transmitting layer and PTOPT and PBD are mixed to form a light emitting layer 31. The steps of manufacturing the structure are: making a transparent conductive thin electrode 2 on a glass Fabricating substrate; then making a light emitting layer 31; manufacturing an electron transmitting layer 32; and last manufacturing a metallic electrode 4. As shown in FIG. 3, when a DC voltage is applied on both the transparent electrode 2 and metallic electrode 4, an ultra violet light of the wave length 394 nm is produced. It is possible to form an OEL which can emit a near ultra violet light of the wave length 380~400 nm by simply varying the composition of an organic light emitting material.

An inorganic material ZnS and organic material have been used as fluorescent material. Inorganic materials are employed in this invention, which can be excited by 380–400 nm wave-length and in turn emit visible light, such as red, blue and green light. It is easy to find its source which is more reliable and stable in intensity. There is a variety of inorganic fluorescent material, e.g., (Ba, Mg, Eu) $Al_{14}O^{19}$, with $\lambda$=454 nm, for blue light; $SrAl_2O_4$:Eu, Mg or $MgAl_{11}O_{19}$ with $\lambda$=525$\mu$, for green light; $Y_2O_2S$:Eu with $\lambda$=630 nm, for red light. The oxide fluorescent materials are more stable in comparison with other inorganic fluorescent material and can eudure over 50,000 hours, while fluorescent materials of subject and chloride are humidity-sensitive, they can last tens of thousand hours if a good humidity-resistant treatment is provided.

As for the fluorescent material, both inorganic materials as ZnS, or organic materials may be used. As for the fluorescent material which can be excited by lights having wave length between 380~400 nm reliably emitable of visible R, G, B three lights, it may be easier to select from inorganic materials than from organic ones, such as (Ba, Mg, Eu) $Al_{14}O_{19}$ excited by 454 nm for blue color light; $SrAl_2O^4$:Eu, Mg or $MgAl_{11}O_{19}$ (Ce, Tb) excited by 525 nm for green light; and ($Y^2O_2S$:Eu) excited by 630 nm for red light, wherein oxides capable of being excited by near ultra violet lights of 380~400 nm are most stable ones which are so durable to have the lifetime longer than 50,000 hours. Other sulfide and fluoride may maintain their lifetime up to several $10^4$ hours if being properly protected from humid atmosphere.

BRIEF DESCRIPTION OF THE DRAWINGS

The invention, as well as its many advantages, may be further understood by the following detailed description and drawings in which.

Figure 1:
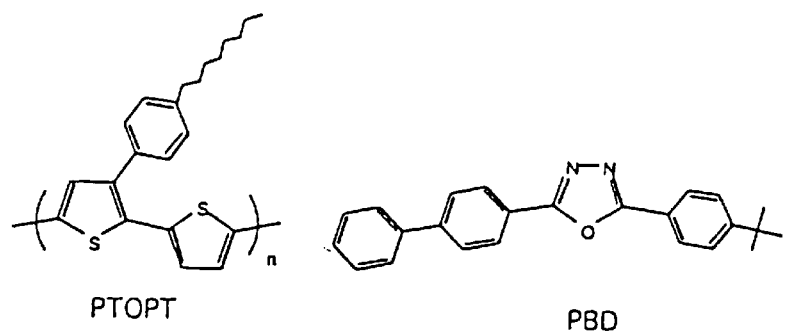
FIG. 1 shows the formula of molecular structure for conventional ultra violet light emitable material PTOPT and PBD.
Figure 2:
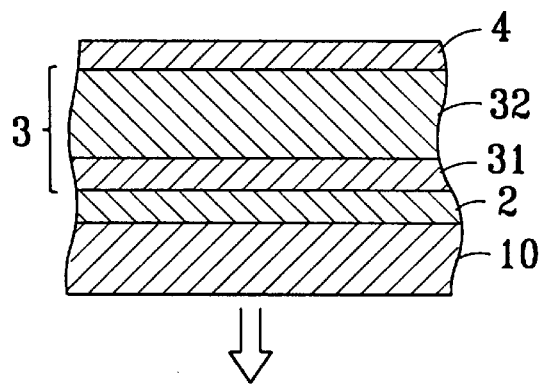
FIG. 2 is the drawing of a conventional structure of ultra-violet organic electroluminescent.
Figure 3:
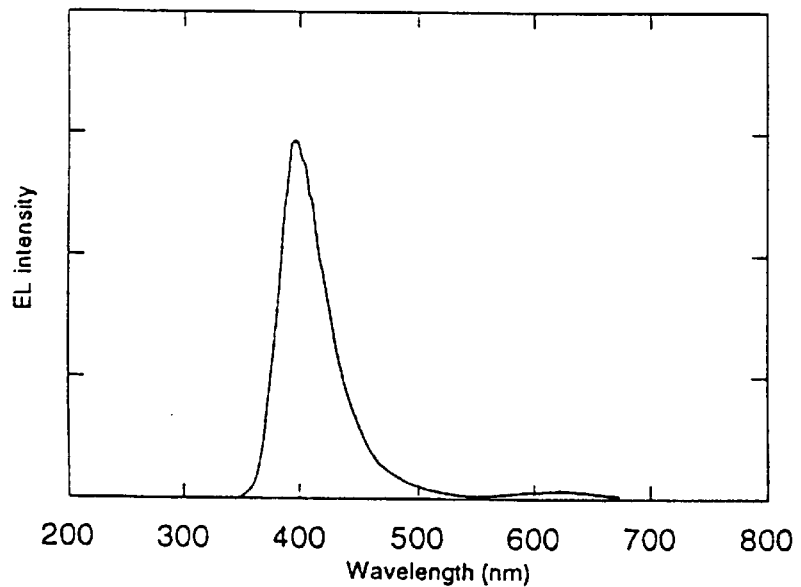
FIG. 3 is the light spectrum of a conventional ultra-violet organic electroluminescence.

Throughout the drawings, like terms and reference numerals are used for designation of like or equivalent parts or portions in the figures, and redundant references will be omitted for simplicity of illustration and explanation, in which:

2 transparent electrode
3 ultra-violet light emitting organic layer
   31 light emitting layer material PTOPT; PBD
   32 electron transmitting layer PBD
4 metallic electrode
5 protective layer
6 fluorescent layer
   6R red fluorescent layer
   6G green fluorescent layer
   6B blue fluorescent layer
7 black ink frame
8 light reflective and insulation layer
10 upper glass
11 lower glass
12 surface glass (cover glass)

DETAILED DESCRIPTION OF THE PREFERRED EMBODIMENT

Figure 4:
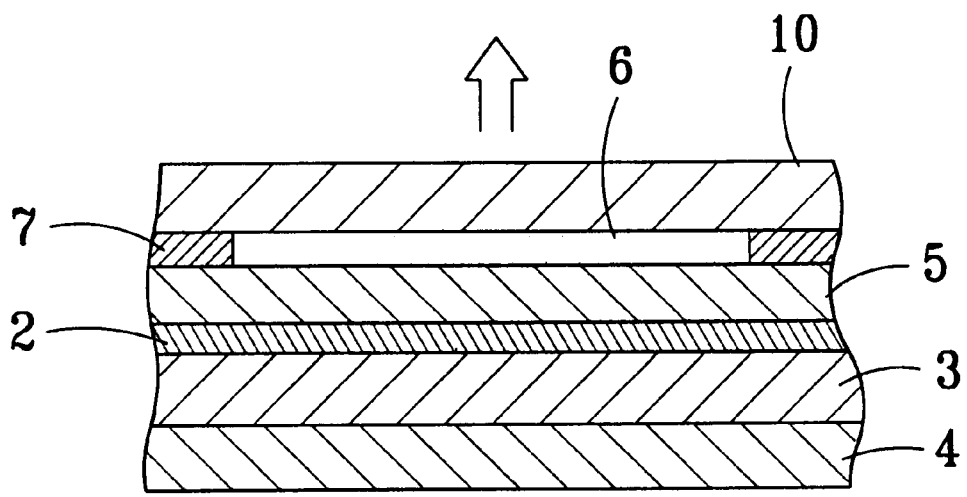
FIG. 4 is a drawing illustrating how a fundamental ultra-violet organic electroluminescent element converts an ultra-violet light to a visible light in the present invention.

FIG. 4 is a drawing illustrating how a fundamental ultra-violet organic electroluminescent element converts an ultra-violet light into a visible light, in which a DC voltage is applied to a metallic electrode 4 and a transparent electrode 2 and an ultra-violet light emitting organic layer 3 interposed between them to produce an ultra-violet light penetrating through the transparent electrode 2 and a protective layer 5, and directly exciting a fluorescent layer 6 inside protective layer, which absorbs shorter wave-length ultra-violet light and emits visible light through conversion of the energy gap of the fluorescent material. If the fluorescent layer 6 is made of a red light emitting material, red light will be emitted. Similarly, if the blue material and green material are used in layer 6, then blue and green light will be emitted respectively. The direction of the arrow in FIG. 4 represents the direction of light emitted.

Figure 5:
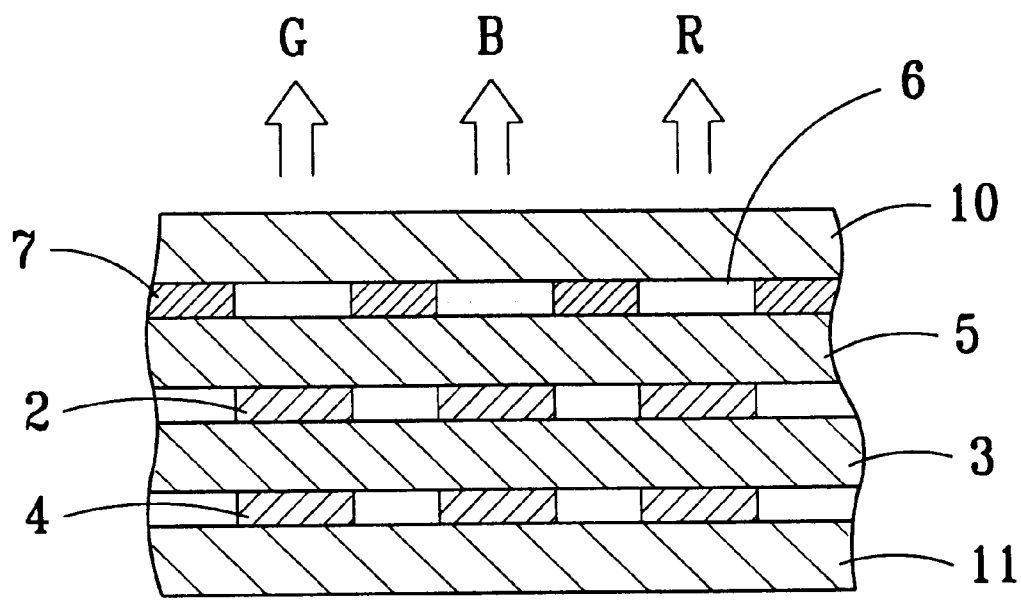
FIG. 5 is a drawing showing the structure of a full-color organic electroluminescent device of the present invention.

FIG. 5 is a drawing showing the structure of a full-color organic electroluminescent device of the present invention, in which the metallic electrode 4, the transparent electrode 2 and the fluorescent layer 6 are cut and separated to form three independent light emitting parts respectively. Among these red (6R), blue (6B) and green (6G) three different colored sub fluorescent layers are formed in the layer 6 for emitting red, blue and green lights respectively.

The manufacturing procedures of the structure shown in FIG. 5 are: printing a black ink frame 7 and three color fluorescent layer 6 of red, blue and green onto a glass substrate 10, if the light emitting portion is large, a net printing technique may be used, if the light emitting portion is small, lithographic mask must be used. Such a treatment can be carried out with known techniques similar to those to form a conventional color LED light filter. After completion of forming the R, G, B three color fluorescent layer, a transparent protective layer 5 must be coated to protect the fluorescent layer 6; then afterwards coating with the transparent electrode 2 made of ITO, and utilizing the etching techniques to remove the unwanted pattern for the transparent electrode; then forming the ultra-violet organic light emitting layer 3 by plating; then forming the metallic electrode 4 by plating, and removing the unwanted portions of the ultra-violet organic light emitting layer 3 and the metallic electrode 4 by etching; finally enclosing the structure with an upper glass 10 and a lower glass 11 to finish forming a full-color organic electroluminescent structure containing R, G, B three colors.

Figure 6:
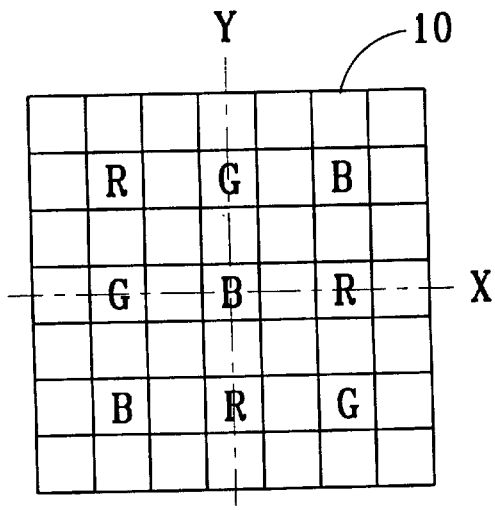
FIG. 6 is a top view of the full-color organic electroluminescent structure of the present invention.
Figure 7:
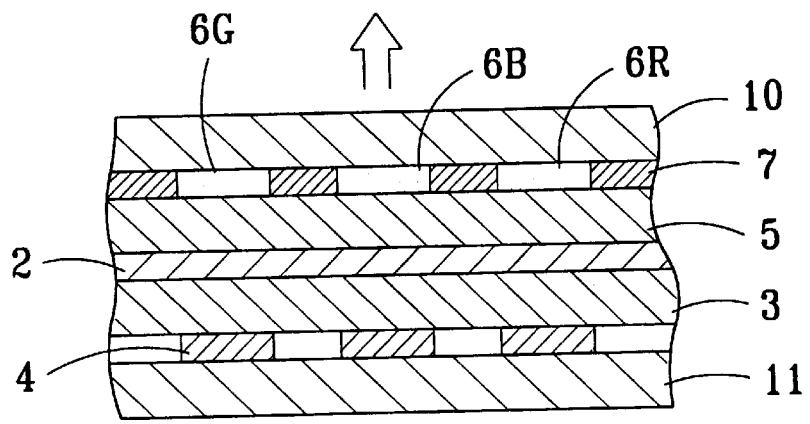
FIG. 7 is a lateral cross section view of the full-color organic electroluminescent structure of the present invention.
Figure 8:
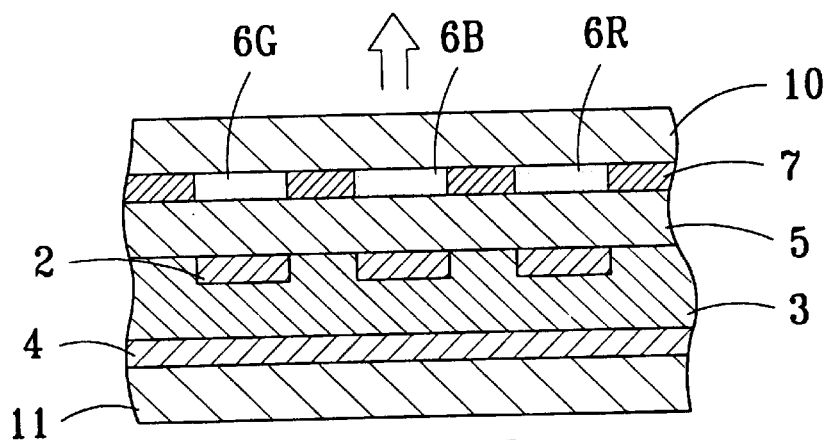
FIG. 8 is a longitudinal cross-section view of the full-color organic electroluminescent structure of the present invention.

Referring to FIG. 6, a top view of the full-color organic electroluminescent structure of the present invention, its lateral cross-section view is shown in FIG. 7, and its longitudinal cross-section view shown in FIG. 8, a plane type organic light emitting layer 3 is used in this embodiment in stead of using a matrix type shown in FIG. 5. A DC voltage is applied between the metallic electrode 4 and the transparent electrode 2 for the organic light emitting layer in said electrodes area to produce an ultra-violet light passing through both the transparent electrode 2 and the protective layer 5 and exciting the fluorescent layer 6 to emit R, G, B lights. If the pixels on the structure are increased enormously, a full-color display screen may be formed.

Figure 9:
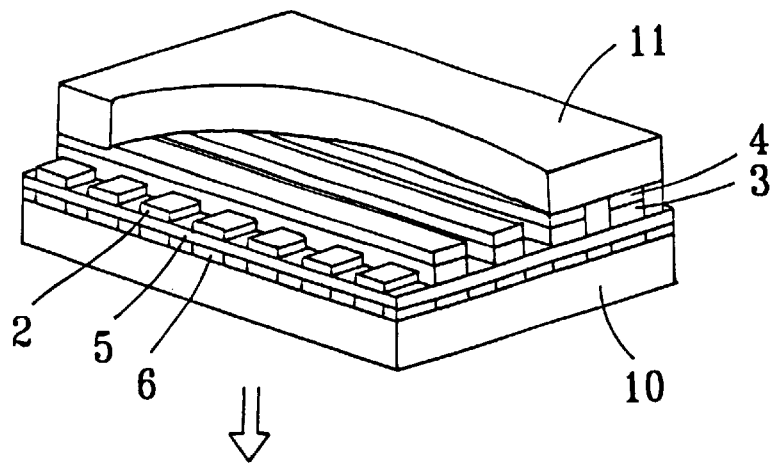
FIG. 9 is a three dimensional explanatory, illustration structure drawing of the full-color organic electroluminescent device of the present invention.

FIG. 9 is a three dimensional explanatory illustration structure drawing of the full-color organic electroluminescent device of the present invention, wherein an arrow direction represents the direction of light emitted. The manufacturing procedure of this device is: coating a fluorescent layer 6 and a black ink frame 7 on the surface of a glass substrate 10, the function of the black ink frame 7 is essentially for enhancing black and white contrast; coating a protective layer 5 and subsequently coating a transparent electrode 2 by sputtering ITO thin film; etching out the electrode pattern; coating an ultra-violet light emitting organic layer 3; then coating a metallic electrode 4; then etching out the electrode pattern; and finally enveloping the structure with a lower glass 11.

Figure 10:
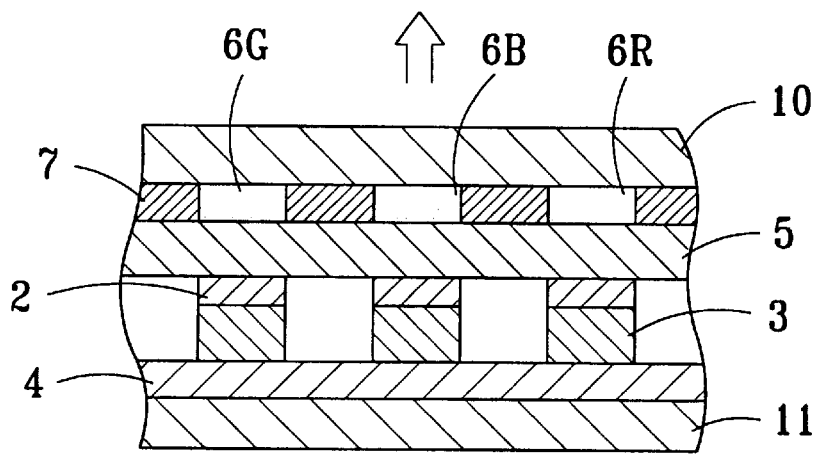
FIG. 10 is a lateral cross sectional view of the full-color organic electroluminescent structure in a second embodiment of the present invention.
Figure 11:
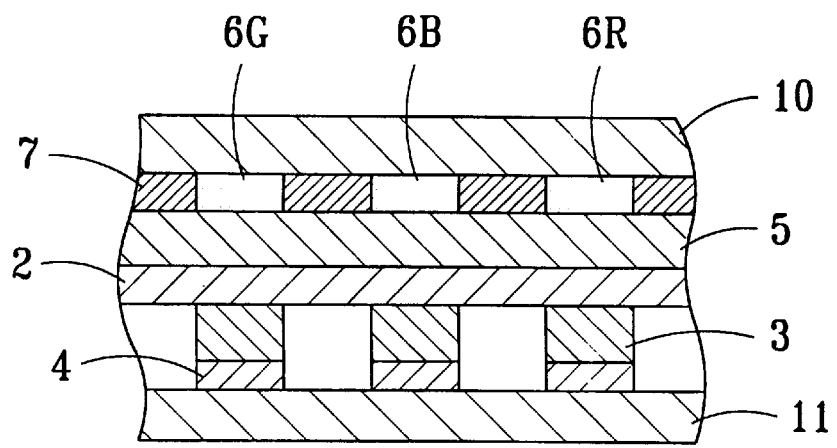
FIG. 11 is a longitudinal cross sectional view of the full-color organic electroluminescent structure in a second embodiment of the present invention.

FIGS. 10 and 11 show respectively a lateral and a longitudinal cross-section view of the full-color organic electroluminescent structure in a second embodiment of the present invention. The point matrix type is utilized in making the organic light emitting layer 3 in this embodiment, which is different from plane type used in forming the layer 3 of FIGS. 7 and 8. The brilliance of light emitted by a point matrix type light source is more intensive than that of light emitted by plane type light source, but its manufacturing steps are much more complicated as described in preceding FIG. 5.

Figure 12:
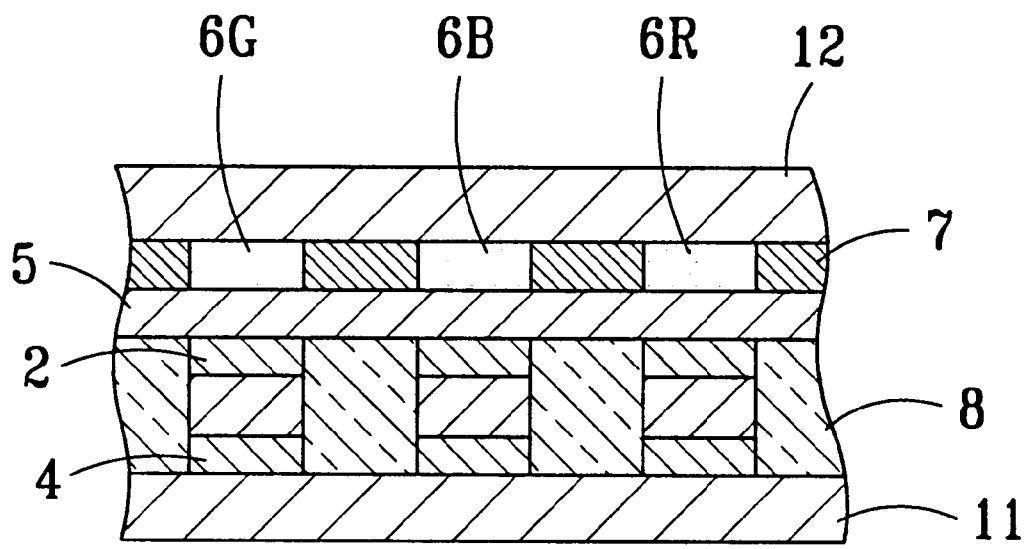
FIG. 12 is a drawing showing the structure of a full-color organic electroluminescent structure in a second embodiment of the present invention.

The light emitting layer 3 shown in FIGS. 10, 11 and 12, wherein the light emitting area of an OEL is fabicated in point matrix type, each pixel can emit light individually. Such a structure may produce a light with more intensive brilliance than that of the light obtained from OEL with its light emitting areas distributed in plane type. This reason is obvious because point light source is brighter than a plane light source with the same luminous intensity. The light emitting areas of an OEL all exist on the interface layer, the light produced from the interface layer is to pass through several layers of OEL material before it can emit through the structure. During passing through such layers of OEL material, part of the light is inevitably absorbed which reduces the brightness of the emitted light. In the present invention, the light emitting area in the organic electroluminescent device, is fabricated into matrix type point emitting light source. As far as the lightness efficiency is concerned, a point light source is much more intense than that of identical area light source (with respect to area of electrode). To compensate the above described loss, the present invention enlarges the width of the metallic electrode to enhance the effect of light reflection. In addition, as shown in FIG. 12, a light reflecting and insulation layer 8 is provided between the pixels or at the surroundings of the pixels to increase the brightness, the insulation material for the layer 8 may be white paint or others which can reflect near ultra-violet light and with fringe insulation effect. Up to now, this is believed to be the most innovative improvement in the field of OEL techniques. An isolating layer may be used instead of the reflecting layer by employing a black ink to isolate light emitted between adjacent points in order to prevent light overlapping each other.

Figure 13:
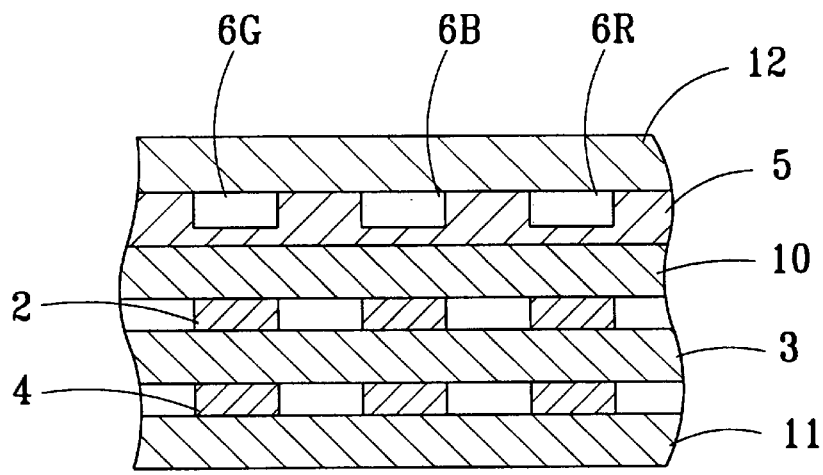
FIG. 13 is a drawing (a) showing the structure of a full-color organic electroluminescent structure in a third embodiment of the present invention.

FIG. 13 shows the structure (a) of a full-color OEL in a third embodiment of the present invention, in which a pattern of the fluorescent layer 6 is at first printed on the surface of a glass 12; then afterwards bonding it with sealant on to the ready made ultra-violet OEL element. The manufacturing method is so simple that it comprises only the two above described steps. It should be understood that the equipment and production method in fabricating thin films for the preceding and subsequent steps are different, so it is convenient to separate the manufacturing in two steps, then bonding them together as finishing fabrication process.

Figure 14:
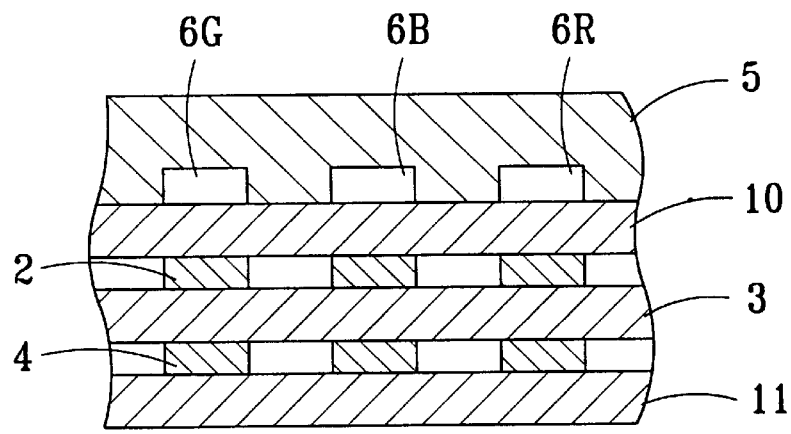
FIG. 14 is a drawing (b) showing the structure of a full-color organic electroluminescent structure in a third embodiment of the present invention.

FIG. 14 shows the structure (b) of a full-color OEL in a third embodiment of the present invention, in which at first the fluorescent layer 6 is printed on the glass 10 of an ultra-violet light OEL, and then a protective layer 5 is coated on it such that the fluorescent material can be excited by the ultra-violet light OEL device to produce R, G, B lights.

Figure 15:
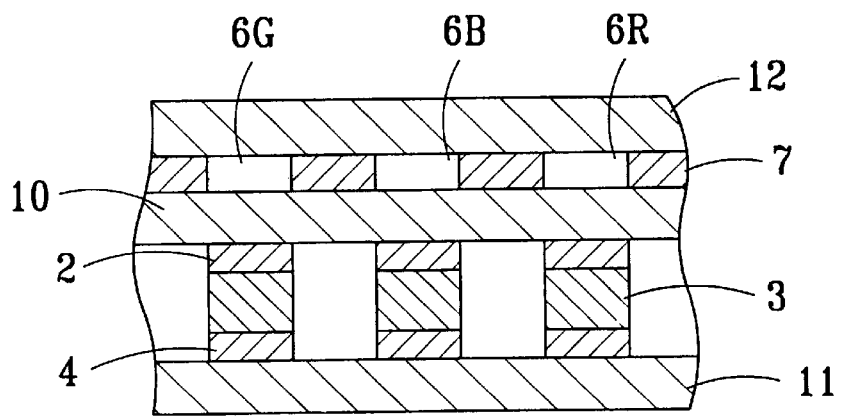
FIG. 15 is a drawing (c) showing the structure of a full-color organic electroluminescent structure in a third embodiment of the present invention.

FIG. 15 shows the structure (c) of a full-color OEL in a third embodiment of the present invention, in which first the fluorescent layer 6 and the black ink frame 7 are printed on the surface of the glass 10 of the ultra-violet light OEL device, then a surface glass 12 is bonded with a sealant to function as a protective layer.

The structure (a), (b) and (c) as shown in FIGS. 13, 14 and 15 in the third embodiment of the present invention are commonly characterized in that ultra-violet light is produced by a ready-made ultra-violet light OEL device to excite each fluorescent layer located at the position corresponding to its respective light emitting surface to perform R, G, B full-color light emitting.

In the third embodiment of the present invention, as shown in the structure of FIGS. 13, 14 and 15 net printing technique is used for coating the fluorescent media layer. This is normally used by production process in plasma display (PDP) or cathode ray tube (CRT). A pixel to pixel distance by this method may be as close as 0.22 mm while it is about 0.27 mm for a common computer display and 0.25 mm for a high resolution display. The introduction of such a technique to the OEL display industry may minimize the equipment investment capital and cost, and facilitates mass production. It will be cost-effective to apply this technology on organic electroluminescent display.

The light used in-door or out-door may consist of 400 nm ultra-violet light; which may enter the transparent material or transparent glass surface of the present invention. In order to avoid the light with wave-length less than 400 nm to pass through the top surface glass 10 or surface glass 12, a material must be utilized or thin film sputtering treatment is required to block the light with wave-length below 400 nm.

Recently, Idemitso Kosan K.K. Japan have developed a new full-color display with a thickness of only 2 mm which astonished skilled people in that field, but it still has a shortcoming of insufficient brilliance due to addition of a light filter. This product is made by a patented process of the above mentioned U.S. Pat. No. 5,294,870 aquired by Eastman Kodak Company.

In conclusion, The essential deference between "Full-color Organic Electroluminescent Device" of the present invention and Kodak's "Organic Electroluminescent Multicolor Image Display Device" of the U.S. Pat. No. 5,294,870 may be compared as follows:

1. The use of light source is different, the present invention utilizes an ultra-violet light organic electroluminescence, while Messrs. Kodak Utilize a blue light organic electroluminescence.
2. The present invention uses an ultra-violet light to excite individual fluorescent media layer to produce R, G, B three colors, while Messrs. Kodak use a blue light filtering layer on the red and the green fluorescent media layers to obtain red and green lights.
3. The present invention installs a black ink frame between pixels on the fluorescent media layer to enhance light contrast, but Messrs. Kodak do not have any resembling means.
4. The fluorescent media layer of the present invention may be coated on the outer glass surface of the ultra-violet light organic electroluminescent device, and then protected by a sealant, but Messrs. Kodak do not have any resembling means.
5. The present invention has adopted a certain kind of glasses as external surface glass of UVOELD, which can block the unwanted ultra-violet ray below 400 nm in wave-length. Messrs. Kodak do not have the design of the said identical effects.

It is clear now that the full-color organic electroluminescent device of the present invention is characterized in that an OEL element emitable of ultra-violet light is used as a basic element for an ultra-violet light source, the fluorescent media layer provided thereon can produce desired R, G, and B lights corresponding to the fluorescent media used. In addition, its simple production process leads to reducing the equipment investment and production cost and also facilitating rapid mass production as well.

In conclusion, the present invention of "Full-color Organic Electroluminescent Device" has utilized organic material capable of emitting ultra-violet light to fabricate an Ultra-violet Organic Electroluminescent Device, and has coated a layer the glass surface with fluorescent material, which can produce Red, Green, Blue light when excited by ultra-violet ray. The interative design of UVOELD in fabricating "Full-color Organic Electroluminescent Device", the fabrication process is most simple, without utilizing filter, the optimum way for mass production of display. Therefore, according to patent law, the present invention is quite appropriate to apply a patent.

Many changes and modifications in the above described embodiments of the invention can, of course, be carried out without departing from the scope thereof. Accordingly, to promote the progress in science and the useful arts, the invention is disclosed and is intended to be limited only by the scope of the appended claims.

What is claim is:

1. A full-color organic electroluminescent device having a light emitting direction and comprising:
   a) a first glass layer;
   b) a first electrode located on the first glass layer, the first electrode comprising a plurality of first electrode strips extending in a first direction;
   c) a second electrode comprising a plurality of transparent second electrode strips extending in a second direction;
   d) an ultra-violet light emitting organic material located between and in contact with the first and second electrodes;
   e) a protective layer having one side facing the second electrode and an opposite side;
   f) a plurality of discreet, spaced apart areas of fluorescent material located on the opposite side of the protective layer, each area of fluorescent material being aligned with one of the plurality of second electrode strips in the light emitting direction, the areas of fluorescent material comprising at least one area of a green fluorescent material, at least one area of blue fluorescent material and at least one area of red fluorescent material;
   g) a black ink frame applied to the same side of the protective layer as the spaced apart areas of fluorescent material and located in the space between the areas of fluorescent material; and,
   h) a second glass layer in contact with the plurality of areas of fluorescent material and the black ink frame.

2. The full-color organic electroluminescent device of claim 1, comprising a planar layer of ultra-violet light emitting organic material between the first and second electrodes.

3. The full-color organic electroluminescent device of claim 1, further comprising an insulating, light reflective material located between adjacent first electrode strips and between adjacent second electrode strips, the insulating, light reflective material being in contact with the first glass layer and the protective layer.

4. The full-color organic electroluminescent device of claim 1, wherein the transparent second electrode strips extend in a second direction different from the first direction such that the first and second electrode strips form a plurality of intersection areas when viewed in the light emitting direction.

5. The full-color organic electroluminescent device of claim 4, comprising a planar layer of ultra-violet light emitting organic material between the first and second electrodes.

6. The full-color organic electroluminescent device of claim 4, comprising a plurality of discreet, spaced apart areas of ultra-violet light emitting organic material located between the first and second electrode strip at the plurality of intersection areas.

7. The full-color organic electroluminescent devices of claim 6, wherein the discreet, spaced apart areas of fluorescent material are aligned with intersection areas of the first and second electrode strips in the light emitting direction.

8. A full-color organic electroluminescent device having a light emitting direction and comprising:

a) a first glass layer;

b) a first electrode located on the first glass layer, the first electrode comprising a plurality of first electrode strips extending in a first direction;

c) a second electrode comprising a plurality of transparent second electrode strips extending in a second direction;

d) an ultra-violet light emitting organic material located between and in contact with the first and second electrodes;

e) a protective layer having one side facing the second electrode and an opposite side;

f) a second glass layer having a first side facing toward the first and second electrodes and a second side facing away from the first and second electrodes;

g) a plurality of discreet, spaced apart areas of fluorescent material printed on one of the first and second sides of the second glass layer, the spaced apart areas of fluorescent material comprising at least one area of a green fluorescent material, at least one area of blue fluorescent material and at least one area of red fluorescent material; and h) a protective layer on the same side of the second glass layer as the discreet, spaced apart areas of fluorescent material.

9. The full-color organic electroluminescent device of claim 8, wherein the plurality of discreet, spaced apart areas of fluorescent material are printed on the first side of the second glass layer.

10. The full-color organic electroluminescent device of claim 8, wherein the plurality of discreet, spaced apart areas of fluorescent material are printed on the second side of the second glass layer.

11. The full-color organic electroluminescent device of claim 9, further comprising a third glass layer located between the protective layer and the second electrode.

* * * * *